United States Patent [19]
Armstrong et al.

[11] Patent Number: 5,482,612
[45] Date of Patent: Jan. 9, 1996

[54] METHODS AND SYSTEMS FOR SHIELDING IN SPUTTERING CHAMBERS

[75] Inventors: Frank O. Armstrong; Brian B. Jeffreys, both of Lubbock, Tex.

[73] Assignee: Texas Instruments Incorporated, Dallas, Tex.

[21] Appl. No.: 286,586

[22] Filed: Aug. 5, 1994

Related U.S. Application Data

[63] Continuation of Ser. No. 967,900, Oct. 27, 1992, abandoned.

[51] Int. Cl.$^6$ .................................................. C23C 14/34
[52] U.S. Cl. .................................. 204/298.11; 204/192.12
[58] Field of Search ........................ 204/192.12, 298.11, 204/298.18

[56] References Cited

U.S. PATENT DOCUMENTS

| | | | |
|---|---|---|---|
| 4,436,602 | 3/1984 | Harra et al. | 204/298.11 X |
| 5,080,772 | 1/1992 | Hurwitt et al. | 204/298.11 X |
| 5,112,467 | 5/1992 | Zejda | 204/298.11 X |
| 5,202,008 | 4/1993 | Talieh et al. | 204/298.11 X |

OTHER PUBLICATIONS

Cliche, G. & Dallaire, S., "Synthesis & Deposition of TiC–Fe Coatings by Plasma" Surface & Coatings Technology 46 (1991), pp. 199–206.
d'Heurle, F. M., "Metallurgical Topics in Silicon Device Interconnections: Thin Film Stresses" Intl. Materials Review 1989, vol. 34, No. 2, pp. 53–68.
Dobson, Joel L., "Characterization of Sputter Processing" Texas Instruments Technical Report No. 03–91–06, 1990.
Dobson, Joel et al. "Reducing Sputter Loadlock Generation of Particles," Texas Instruments Technical Journal Mar./Apr. '92, pp. 104–113.
Grutzner, Heinrich et al. "A Novel Shear Test for Plasma–Sprayed Coatings" Surface & Coatings Tech. 45, 1991, pp. 317–323.
Haghiri–Gosnet, A. M. et al. "Stress & Microstructure in Tungsten Sputtered Thin Films", J. Vac. Sci. Tech. A7(4), Jul./Aug. 1989 pp. 2663–2669.
Hoffman, D. W. et al. "Compressive Stress & Inert Gas in Mo Films" J. Vac. Sci. Tech. 17(1) Jan./Feb. 1980, pp. 380–383.
Hoffman, D. W. et al. "Effects of Substrate Orientation & Rotation" J. Vac. Sci. Tech. vol. 16, No. 2 Mar./Apr. 1979, pp. 134–137.
Hoffman, Vance, "Tungsten/Titanium Diffusion Barrier Metallization" Varian Semiconductor Equipment Group Rept. No. 33.
Howard, S. J. et al, "Interfacial Fracture Toughness of Vacuum–Plasma–Sprayed Coatings" Surface & Coatings Tech. 45 (1991) pp. 333–342.
Huaxia, Ji et al. "Characterization of Plasma–Sprayed Titanium Coatings on Stainless Steel" Surface & Coatings Tech. 45(1991) pp. 121–127.
Iscoff, Ron "Gas Purity? Watch Those Process Tools" Semiconductor Intl. Mar. 1991, pp. 52–55.
Ito, Toshiya et al., "Mechanical Properties of Cu/Al Multi–layered Thin Films" Surface & Coatings Tech., 45(1991) pp. 215–220.
McLachlan, David et al. "Refractory Metals for Barriers, Contacts & Interconnect" Materials Research Corp., Dec. 1980, pp. 1–39.
Saito, S. et al. "TiW as a Barrier Metal for Small Contacts" Materials Research Society, 1987, pp. 319–324.

(List continued on next page.)

*Primary Examiner*—Nam Nguyen
*Attorney, Agent, or Firm*—Robby T. Holland; Wade James Brady, III; Richard L. Donaldson

[57] ABSTRACT

An improved metal film deposition system is disclosed which comprises an improved shield (80) to prevent particulate contamination of processed wafers. The shield (80) includes an interstitial layer of flame–sprayed metal which adheres well to both the material comprising the metal film and the metal comprising the shield (80). Further, the shield utilizes radiused deflections (84) and (86) to disperse the forces created by the crystalline growth of the metal film.

3 Claims, 3 Drawing Sheets

OTHER PUBLICATIONS

Sanders, J. Y., "Structure of Evaporated Metal Films" ed. J. R. Anderson 1:1–38, London & New York.

Thornton, John A. "High Rate Thick Film Growth", Ann. Rev. Mater. Sci. 1977, 7:239–260.

Thornton, John A. "Magnetron Sputtering: Basic Physics & Application to Cyl. Magnetron" J. Vac. Sci. Tech. 15(2) Mar./Apr. 1978 pp. 171–177.

Thornton, John A, "Microstructure of Sputter-Deposited Coatings", J. Vac. Sci. Tech. A4(6) Nov./Dec. 1986, pp. 3059–3065.

Varian Semiconductor Equipment Group, Product Support Bulletin #833A, Dec. 1990.

Waterman, Ernie et al. "Tungsten–Titanium Sputtering Target" 7th Intl. VLS Multilevel Inter. Conf., IEEE Catalog No. 90TH0325-1, pp. 329–331.

Wickersham, C. E. Jr., et al. "Target Operating Temperatures" TOSOH SMD Technical Note TKN 9.008A.

Wresh, Wm. P., "Nippon Mining Particle Getter Film Evaluation on Anelva ILC–1015 Sputter Systems" AMOS–1 Eng. Report, Dec. 1991, pp. 1–42.

Windischmann, H. et al. "Intrinsic Stress in Sputtered Thin Films" J. Vac. Sci. Technol. A9(4), Jul./Aug. 1991, pp. 2431–2436.

METHODS AND SYSTEMS FOR SHIELDING IN SPUTTERING CHAMBERS

This application is a continuation of application Ser. No. 07/967,900, filed Oct. 27, 1992 abandoned.

TECHNICAL FIELD OF THE INVENTION

This invention relates in general to the field of semiconductor processor equipment and more particularly to improved methods and systems for shielding in sputtering chambers.

BACKGROUND OF THE INVENTION

Semiconductor devices are continuously driven to be more productive, occupy less space, consume less power, and cost less. These advances continually cause new design limitations and liabilities. By reducing the device feature size, the device capacity is increased, but the vulnerability to particle damage is also increased. The structure and operation of semiconductor process machinery is a key focus of the effort to reduce particulate contamination during semiconductor device fabrication. Particulate contamination is a major concern when dealing with the deposition of metal films including refractory metal films which are commonly used as diffusion barriers and for other purposes in modern semiconductor devices.

As metal films are deposited on semiconductor wafers within a fabrication system, metal films are also necessarily deposited on portions of the inner surfaces of the semiconductor processor equipment. The metal deposited on the equipment must adhere to the equipment to prevent particulate contamination of the wafers being processed in the equipment. When the metal deposited on the inner surface of the equipment separates from the equipment, the metal film is said to have delaminated. Delaminated metal from the interior surfaces of process equipment can be a major cause of particulate contamination which can dramatically degrade the process yields associated with device fabrication. For a variety of reasons, process equipment is usually fabricated from a base material such as, for example, stainless steel. For films such as aluminum or titanium, the adhesion to the stainless steel shielding within the process chamber is good. However, refractory films such as molybdenum or titanium-tungsten (Ti-W) are notorious for refusing to adhere to these surfaces due to the high stresses of these films and the incompatibilities of the metal grain sizes between the refractory film and the stainless steel forming the inner surface of the process equipment.

Accordingly, a need has arisen for methods and systems which can prevent the particulate contamination associated with delamination of deposited films from the interior of semiconductor processing equipment used to deposit metallic films.

SUMMARY OF THE INVENTION

In accordance with the teachings of the present invention, a shielding system and method are provided which substantially reduces or eliminates disadvantages associated with prior systems and methods for reducing particulate contamination in metal deposition process equipment.

A system for depositing a metal film on a surface of a semiconductor substrate comprising a sputtering system for creating a metal vapor and directing said vapor to the surface of the semiconductor substrate, a shield proximate the semiconductor substrate operable to shield portions of the system from the metal vapor, said shield comprising a base layer and an interstitial layer of flame-sprayed material operable to adhere to both said base layer and a metal film created by said metal vapor outwardly from said interstitial layer.

BRIEF DESCRIPTION OF THE DRAWINGS

A more complete understanding of the advantages associated with the present invention may be acquired by referring to the attached FIGUREs in which like reference numbers indicate like features and wherein.

DETAILED DESCRIPTION OF THE INVENTION

Figure 1:
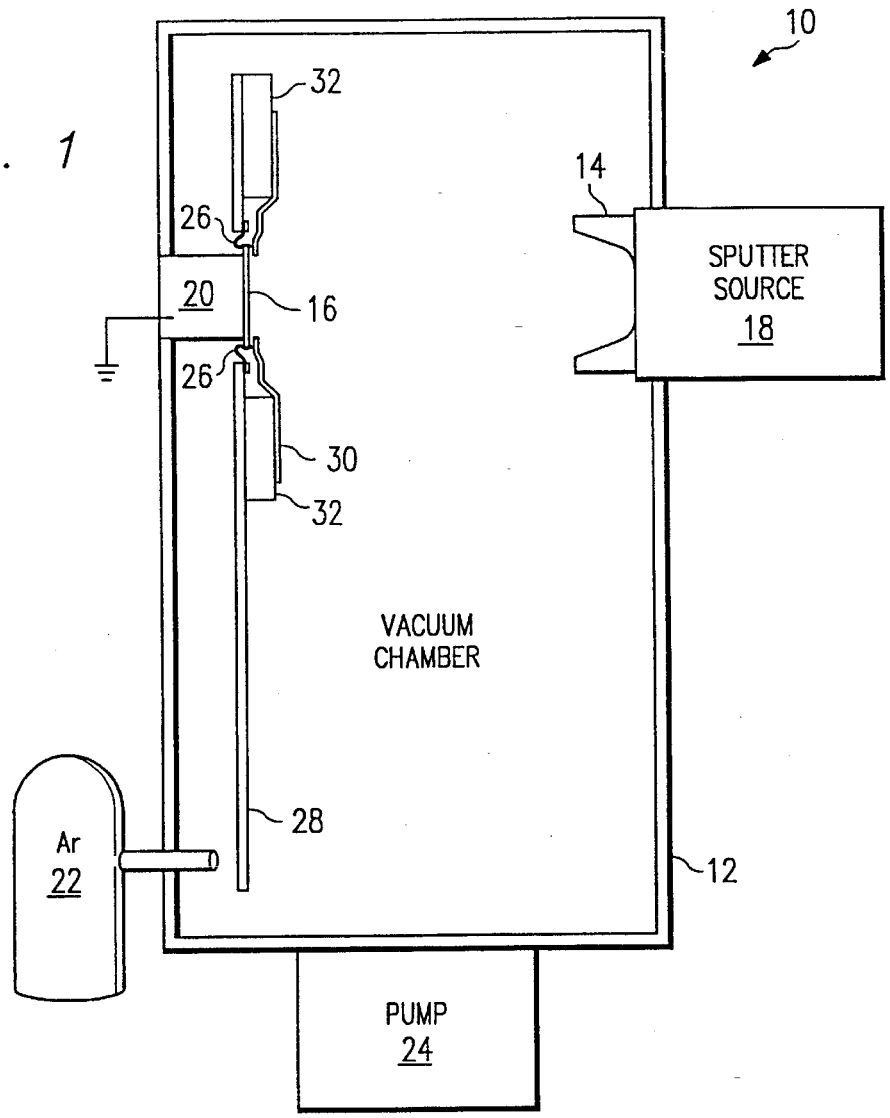
FIG. 1 is a schematic diagram of a sputtering metal film deposition system.

FIG. 1 is a block diagram of a metal film deposition system indicated generally at 10 which comprises a vacuum chamber 12. System 10 functions to sputter metal material freed from a target 14 onto the outer surface of a wafer 16. The target 14 is fixed to a sputter source 18 which carries a large variable negative potential on the order of −1 kilovolt. The wafer 16 is affixed to a heater block 20 which is coupled to ground potential. A pump system 24 is used to evacuate the vacuum chamber 12. An inert gas such as argon is introduced into the vacuum chamber 12 from a source 22. The gas is ionized and accelerated towards the target 14 by the large potential on sputter source 18. The large negative potential on sputter source 18 accelerates the ionized argon towards the target 14. When the argon ions impact the target 14, outer portions of the target 14 are vaporized. Target 14 comprises the metallic substances to be deposited on the outer surface of the wafer 16. For example, the target 14 may comprise aluminum, titanium, molybdenum or mixtures such as titanium-tungsten (Ti-W). The metallic vapor freed from target 14 is then attracted towards ground potential and deposits itself evenly on the outer surface of wafer 16.

Wafer 16 is coupled by clips 26 to a transfer plate 28. Transfer plate 28 serves to transfer the wafers in and out of the vacuum chamber 12 and other process machinery. The metal vapor from target 14 is accelerated towards heater block 20 but will also impact to some extent other exposed surfaces within vacuum chamber 12. In order to provide for ease of cleaning of the interior surfaces of vacuum chamber 12, a shield 30 is provided to cover exposed surfaces adjacent the outer surface of wafer 16. The shield 30 receives the bulk of the metal vapor accelerated towards wafer 16 that is not deposited on wafer 16 itself. Shield 30 is affixed outwardly from wafer 16 and is separated from transfer plate 28 by a pressure plate 32.

As discussed previously, delamination of stray metal films deposited on interior surfaces of the process machinery, such as vacuum chamber 12 and shield 30, can contribute to particulate contamination of wafers, subjected to metal film deposition within process machinery. Because shield 30 is so close to the exposed surface of wafer 16, shield 30 receives a great deal of the metal vapor and metal films quickly accumulate on the outer surface of shield 30. Accordingly, an important consideration in preventing particulate contamination of semiconductor wafers processed within vacuum chamber 12 is to prevent the films accumulated on the outer surface of shield 30 from delaminating.

Figure 2:
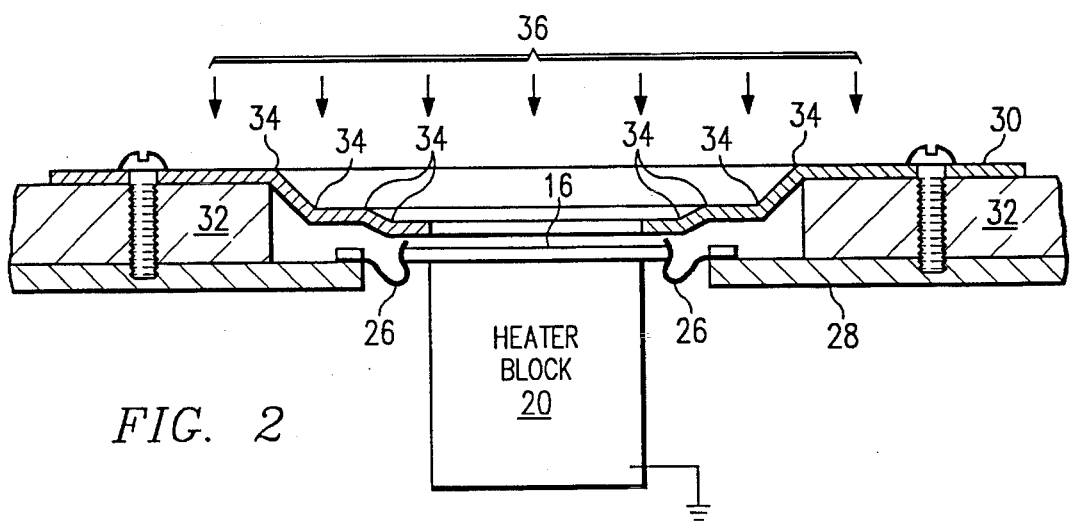
FIG. 2 is a diagram illustrating the configuration of a sputtering metal film deposition system.

FIG. 2 is a cross-sectional illustration showing greater detail of the configuration immediately surrounding wafer 16. Wafer 16 is placed in contact with heater block 20. Wafer 16 is also held in relation to transfer plate 28 by clips 26 affixed to transfer plate 28. The shield 30 illustrated in FIG. 2 comprises a plurality of angular steps or junctions, some of which are indicated at 34 in FIG. 2. Angular junctions 34 serve to prevent shield 30 from shadowing the outer surface of wafer 16 from the impinging metal vapor indicated by arrows 36 in FIG. 2. As will be discussed in more detail herein, the prior art method of using sharp angular junctions such as angular junctions 34 is one of the major contributors to particulate contamination that is addressed by the teachings of the present invention.

Figure 3:
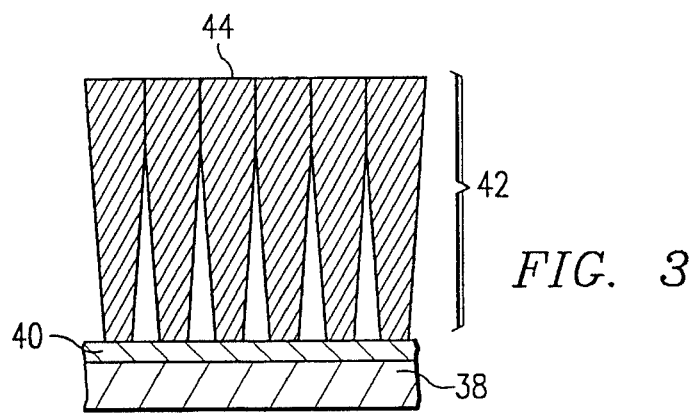
FIG. 3 is a cross-sectional illustration of the columnar growth of metal deposited on a shield surface.

FIG. 3 is a cross-sectional diagram which illustrates the manner in which refractory metal crystals grow as metal vapor is deposited on a surface. FIG. 3 illustrates a cross-section of a portion of a shield 38. Shield 38 has been equipped with an interstitial layer 40 on an outer surface of the base material comprising shield 38. As discussed previously, the base material of shields such as shield 38 may comprise, for example, stainless steel. A layer of refractory metal indicated generally at 42 has been grown on the outer surface of interstitial layer 40. FIG. 3 illustrates both a chief cause of delamination and one method useful in addressing delamination of metal films. As a particular refractory metal crystal, for example a Ti-W crystal 44 indicated in FIG. 3, grows, the dynamics of crystal growth will dictate that the crystal increases in width as it grows outward from the outer surface of interstitial layer 40. Similar crystalline growth will appear in all of the crystals within layer 42. As a result of this crystal formation, stress forces will be introduced parallel to the outer surface of interstitial layer 40. This stress can result in separation of the metal film layer 42 from the shield 38 resulting in delamination and risk of particulate contamination. As discussed previously, certain refractory metals, such as molybdenum and mixtures such as titanium-tungsten, do not adhere well to stainless steel. As a result, the forces created by the crystalline growth within the refractory metals can easily break the interface between the metal film 42 and the shield 38. One approach that has been used in the past is to introduce the interstitial layer 40 between the stainless steel shield 38 and the refractory metal film 42. The interstitial layer 40 may comprise, for example, aluminum which adheres well to both the stainless steel shield 38 and the refractory metal film 42. Prior art methods of using interstitial layers use sputtering techniques to coat the outer surfaces of the shield 38 with a layer of sputtered aluminum prior to use of the shield 38. Using these techniques, the lifetime of a stainless steel shield can be increased from on the order of 665 microns of depositions of refractory metal to on the order of 840 microns of depositions of refractory metal before significant delamination and particulate contamination halts the useful life of the shield.

The chief problem with using sputtered aluminum as the material to form interstitial layer 40 is that the aluminum bonds so well with the stainless steel comprising the stainless steel shield 38 and the refractory metal film 42 that the forces created by the crystalline growth within refractory metal film 42 are almost perfectly translated to the interface between the interstitial layer 40 and the stainless steel shield 38. These forces are translated directly because sputtered aluminum is a very dense material that will not absorb, to a great degree, forces exerted upon it. Accordingly, these forces are translated to the interface of layer 40 and shield 38 can result in delamination of the interstitial layer 40 from the stainless steel layer 38.

According to one aspect of the teachings of the present invention, the interstitial layer 40 is formed using flame-sprayed aluminum as opposed to sputtered aluminum. By utilizing a flame spraying process to deposit interstitial layer 40 on the outer surface of shield layer 38, an "aluminum sponge" is created as opposed to the tightly packed sputtered layer resulting from prior art methods. The aluminum sponge still adheres extremely well to both the stainless steel shield 38 and to the refractory metal deposited outwardly from it, but does not translate the stress forces resulting from crystalline growth of the refractory film, but rather absorbs a great deal of these forces due to its sponge-like structure. Utilizing a flame-sprayed aluminum interstitial layer, the average lifetime of a stainless steel shield can be increased to on the order of 900 microns of refractory metal deposition. Interstitial layer 40 may be flame-sprayed deposited to on the order of 0.040 inch in order to provide the advantages discussed previously.

Figure 4:
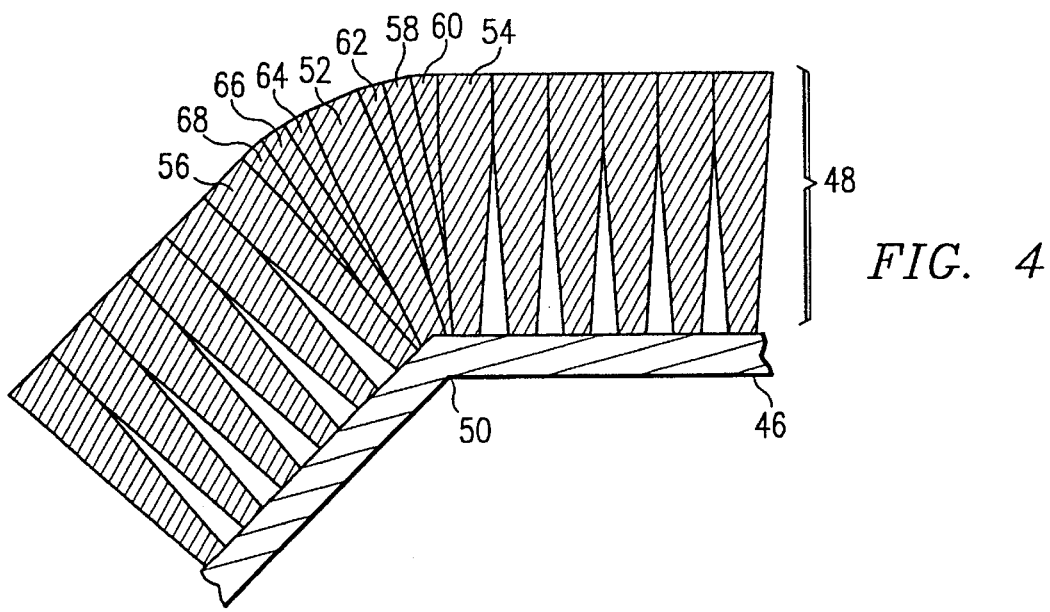
FIG. 4 is a cross-sectional illustration of metal deposited across an angular junction of a shield.

FIG. 4 is a cross-sectional diagram that illustrates the dynamics of crystalline growth which can cause delamination at an angular break point in a shield such as shield 46 illustrated in FIG. 4. FIG. 4 illustrates a refractory metal film indicated generally at 48 which has been deposited on an outer surface of shield 46. Shield 46 comprises an angular break point indicated at 50. A single refractory metal crystal indicated at 52 is shown to have grown outwardly from angular break point 50. In addition, single crystal structures 54 and 56 are shown in FIG. 4 to have grown on either side of crystal 52 proximate angular break point 50. As discussed previously, refractory metal film crystals including crystals 52, 54 and 56 shown in FIG. 4 will grow in columnar structures which will slightly increase in width as they grow outward from a surface. This crystalline growth results in gaps between crystals 52 and 54 and between crystals 52 and 56 which are filled by crystalline structures 58, 60, 62, 64, 66 and 68. As can be seen in FIG. 4, crystals 58 through 68 result from the introduction of sputtered metal vapor into the gaps between crystals 52 and 54 and 52 and 56 and are not directly coupled to the outer surface of shield 46. The tapered columnar growth of the crystals identified previously in FIG. 4 results in an outward force being exerted at the junction of crystal 52 with the outer surface of shield 46 at angular break point 50. This outer force results from the fact that crystal columns 52 and 58 through 68 are gradually increasing in diameter whereas the space which they occupy between crystal structures 54 and 56 is gradually decreasing in diameter. This is analogous to a cork that is gradually increasing in size stuck in a bottle which is gradually decreasing in size. Similar forces result wherever an angular deflection or break point exists all along the outer surface of a shield exposed to metal film deposition. The stresses at the angular break point can easily result in delamination which will quickly spread to the remaining crystal bodies along the break point. This spreading of delamination results from the fact that once a crystalline body is detached from the outer surface of the shield, the forces once supported by that crystal are translated to the crystal columns proximate the detached crystal. As such, delamination of a single crystal column tends to create a "domino" effect along stress points such as stress points along an angular break point on the outer surface of a shield.

Figure 5:
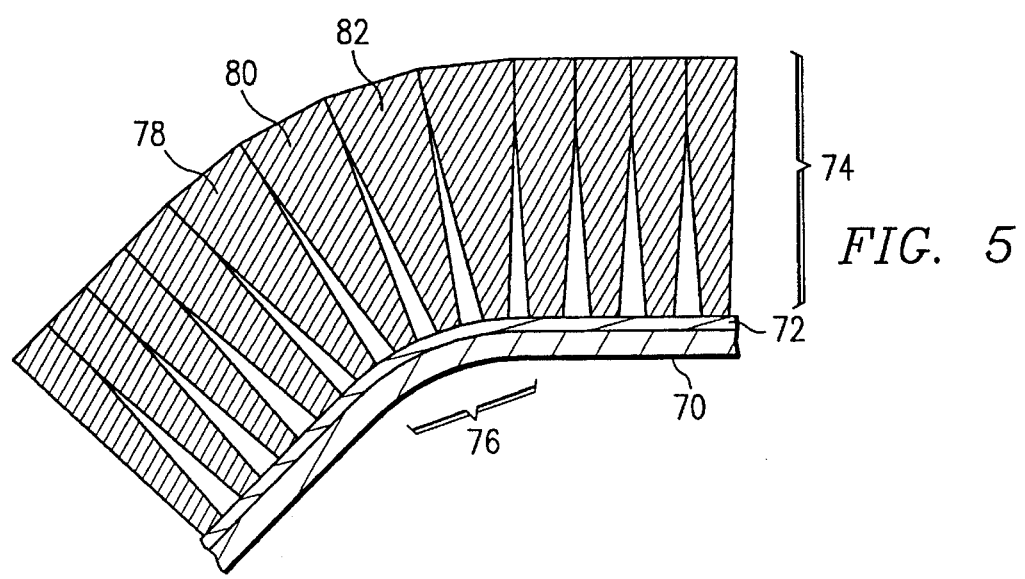
FIG. 5 is a cross-sectional illustration of a metal film deposited on a shield utilizing the radial junctions of the present invention.

FIG. 5 is a cross-sectional illustration of a shield 70 which is constructed according to the teachings of the present invention. An interstitial layer 72 of flame-sprayed metal such as aluminum is formed on the outer surface of shield 70. FIG. 5 also illustrates a metal film indicated generally at 74 which has been deposited on the outer surface of interstitial layer 72. Shield 70 achieves a deflection using a radiused deflection indicated generally at 76. Radiused deflection 76 replaces the angular deflection 50 shown and described with reference to FIG. 4 previously. Radiused deflection 76 results in the same general shape of shield 70 but prevents the troublesome crystalline growth patterns discussed previously with reference to FIG. 4. The crystalline columns 78, 80 and 82 which are proximate the deflection region 76 each are solidly connected to the interstitial layer 72. The radiused deflection 76 further distributes the area along the outer surface of shield 70 which bears the stresses resulting from the crystalline growth of metal film 74. This distribution of forces is in contrast to the single point of force at angular deflection 50 discussed with reference to FIG. 4. Displacement of force along the outer surface of radiused deflection 76 results in a much reduced risk of delamination. It should be understood that FIG. 5 is not to scale in that the height of the crystals shown in FIG. 5 has been greatly exaggerated relative to the angular deflection 76 and the depths of layers 70 and 72 in order to illustrate the advantages of the present invention and the dynamics of crystalline growth involved.

Figure 6:
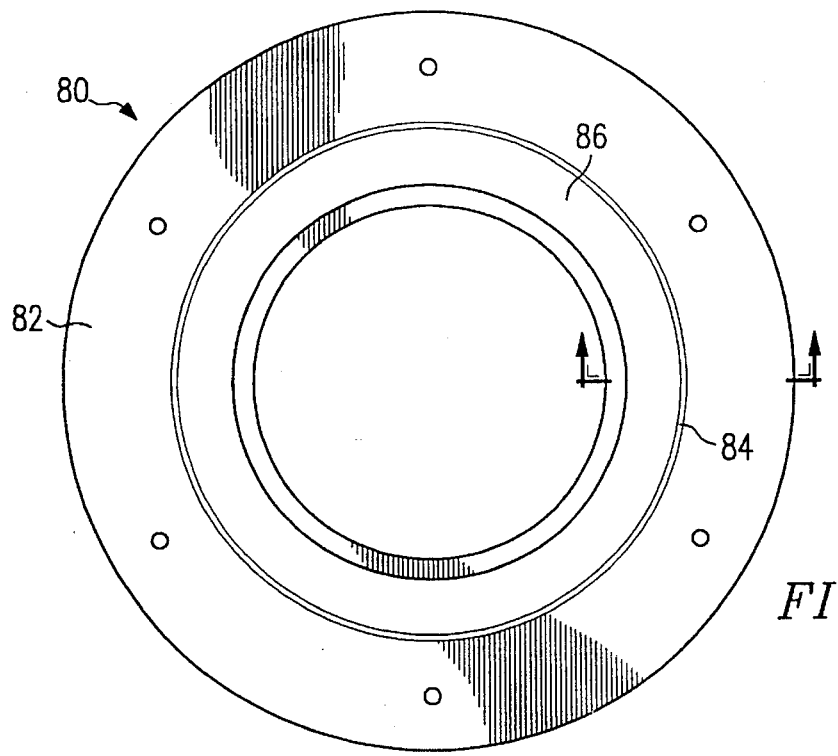
FIG. 6 illustrates a top view of a shield constructed according to the teachings of the present invention.

FIG. 6 is a greatly reduced top view of a shield 80 including the radiused deflections or breaks used to prevent delamination as discussed previously.

Figure 7:
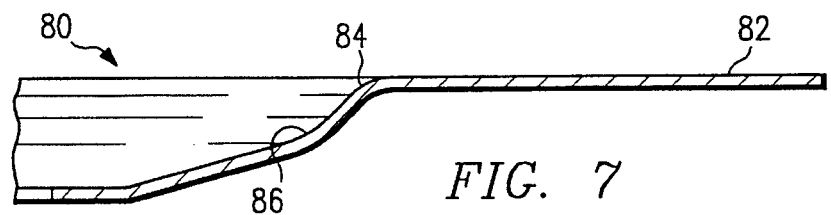
FIG. 7 is a sectional illustration of a shield constructed according to the teachings of the present invention.

FIG. 7 is an illustration of a cross-section indicated in FIG. 6 where shield 80 is shown to comprise an outer surface 82 and a convex radiused deflection 84 and a concave radiused deflection 86. Radiused deflection 84 comprises a radius on the order of 0.188 inches. Radiused deflection 86 comprises a deflection having a radius on the order of 0.375 inches. Radiused deflections 84 and 86 prevent the shadowing of the wafer disposed inwardly from shield 80 but enjoy the technical advantages of preventing delamination of metal film from shield 80. As discussed previously, an interstitial layer comprising, for example, aluminum is flame-sprayed on the surface 82 of shield 80 according to the teachings of the present invention.

Figure 8:
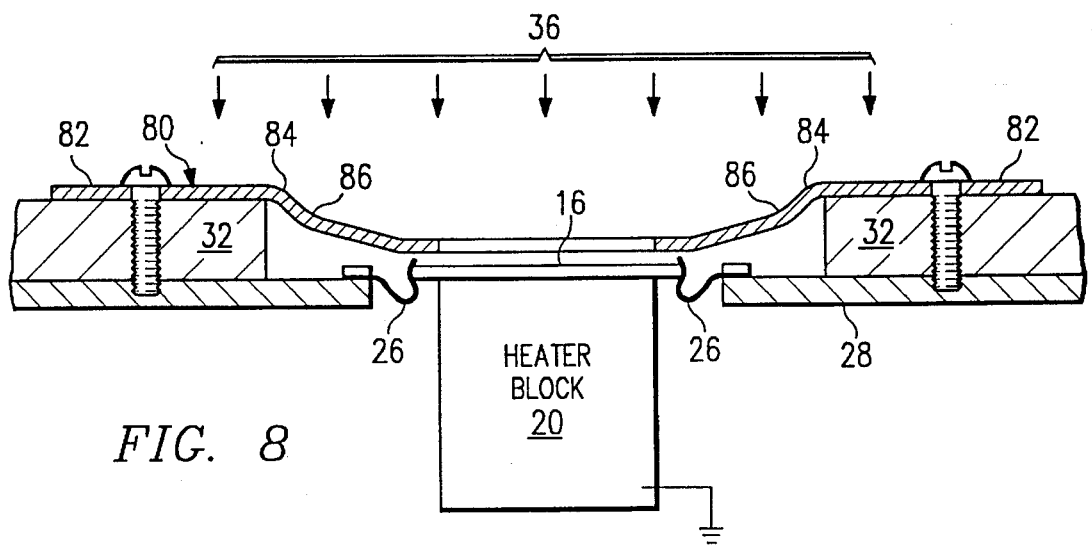
FIG. 8 is a diagram illustrating the use of a shield constructed according to the teachings of the present invention in a metal film deposition system.

FIG. 8 is a cross-sectional illustration showing shield 80 of the present invention as it would be used in the metal deposition system described previously with reference to FIGS. 1 and 2 previously. Shield 80 with radiused deflections 84 and 86 and a coating of flame-sprayed aluminum disposed on surface 82 is used to replace shield 30 described previously. Radiused deflections 84 and 86 prevent shadowing of the wafer 16 from the metal vapor 36 and also prevent delamination of metal deposited on shield 82 as discussed previously.

Accordingly, the shield of the present invention incorporates the use of a flame-sprayed interstitial layer of metal such as aluminum which adheres well to the stainless steel structure of the shield and to the refractory metal film deposited on the outer surface of the interstitial layer. Further, the shield of the present invention includes any deflections necessary to conform to the interior structure of the sputtering chamber and to prevent the shadowing of the wafer being subjected to the metal film deposition, but achieves the deflections using radiused deflections as opposed to angular ones to disperse the stress created by the combination of the deflections and the growth patterns of the metal film crystals. Utilizing both the flame-sprayed interstitial layer and the radiused deflections, the life of a stainless steel shield may be increased to on the order of 1100 microns of deposited refractory metal.

What is claimed is:

1. A system for depositing a metal film on a surface of a semiconductor substrate, comprising:

a sputtering system for creating a metal vapor and directing said vapor to the surface of the semiconductor substrate;

a shield proximate the semiconductor substrate operable to shield portions of the system from the metal vapor; and said shield comprising radiused deflections operable to prevent shadowing of the surface of the semiconductor substrate from said metal vapor and further operable to disperse forces created by crystalline growth of metal film outwardly from said shield to retard delamination of said metal film from said shield;

said shield comprising stainless steel and an interstitial layer of porous aluminum about 0.040 inches thick to adhere to both said stainless steel of said shield and a metal film created from said metal vapor outwardly from said interstitial layer.

2. The system of claim 1 wherein said metal vapor comprises titanium tungsten.

3. The system of claim 1 wherein said metal vapor comprises molybdenum.

* * * * *